United States Patent
Hsu et al.

(10) Patent No.: US 11,630,126 B2
(45) Date of Patent: Apr. 18, 2023

(54) CLIPPED TESTING DEVICE HAVING A FLEXIBLE CONDUCTING MEMBER

(71) Applicants: Hsu-Chang Hsu, Taoyuan (TW); Kuo-Yen Hsu, Taoyuan (TW)

(72) Inventors: Hsu-Chang Hsu, Taoyuan (TW); Kuo-Yen Hsu, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 176 days.

(21) Appl. No.: 16/424,489

(22) Filed: May 29, 2019

(65) Prior Publication Data

US 2019/0377000 A1 Dec. 12, 2019

(30) Foreign Application Priority Data

Jun. 12, 2018 (TW) .................................. 107120125

(51) Int. Cl.
*G01R 1/067* (2006.01)
*G01R 31/364* (2019.01)
*G01R 31/388* (2019.01)

(52) U.S. Cl.
CPC ........... *G01R 1/067* (2013.01); *G01R 31/364* (2019.01); *G01R 31/388* (2019.01)

(58) Field of Classification Search
CPC .... G01R 1/0425; G01R 1/067; G01R 31/364; G01R 31/388; G01R 1/06705; G01R 31/36; H01R 11/282; H01R 11/286
See application file for complete search history.

(56) References Cited

U.S. PATENT DOCUMENTS

| 4,153,321 A | * | 5/1979 | Pombrol | H01R 11/24 24/518 |
| 5,772,468 A | * | 6/1998 | Kowalski | H01R 11/24 439/506 |
| 2017/0040719 A1 | * | 2/2017 | Ranaivoson | H01R 13/631 |
| 2017/0054232 A1 | * | 2/2017 | Toscani | H01R 11/24 |

FOREIGN PATENT DOCUMENTS

CN 204558658 U * 8/2015 ............. Y02E 60/10

* cited by examiner

*Primary Examiner* — Jay Patidar

(57) ABSTRACT

The present invention is related to a clipped testing device, comprising a first clamping member, a second clamping member, a shaft, and a conducting member. The first clamping member has a first pin joint member and a first substrate, the second clamping member has a second pin joint member and a second substrate. The shaft detachably pivoted to a first pin joint member and a second pin joint member. The conducting member is disposed on the first clamping member and is located between the first substrate and the second substrate. The conducting member has an upper surface and a lower surface. The lower surface of the conducting member faces toward the first substrate, and at least a part of the conducting member is wavy-shaped and has a first scraping structure on the upper surface thereof.

15 Claims, 11 Drawing Sheets

CLIPPED TESTING DEVICE HAVING A FLEXIBLE CONDUCTING MEMBER

CROSS REFERENCE TO RELATED APPLICATION

The present application claims priority to Taiwan Patent Application Serial No. 107120125 filed on, Jun. 12, 2018, and the entire content of which is incorporated by reference to this application.

BACKGROUND OF THE INVENTION

1. Field of the Invention

The present invention is related to a clipped testing device, especially related to a clipped testing device having a conducting member structure.

2. Description of the Prior Art

With the development of electric vehicles, people can travel long range by using pure electricity instead of using fossil fuel. In order to increase the driving distance of electric vehicles, more batteries with higher capacity are required. Therefore, ensuring the stability, safety, and reliability of batteries has become an important issue, and it also highlights the importance of testing the quality of the battery.

At present, charging and discharging test may be performed to the battery for testing the quality of the battery, so that the voltage and current characteristics of the battery can be accurately measured, which is a key point while evaluating the quality of the battery. However, in order to avoid oxidation or damage to electrodes of the battery, a protective film is formed onto the surface of the electrodes once the battery is manufactured. If the protective film cannot be scraped off effectively, test connectors would not be able to contact with the electrodes of the battery directly, and the voltage and current characteristics of battery might not be measured accurately. If the protective film is removed mechanically or manually, it will obviously lower the efficiency of the overall testing process. Therefore, the industry needs a test device that is capable of scraping the protective film off directly and exposing the battery electrode during the battery testing process, so the voltage and current characteristics of the battery can be measured more quickly and accurately.

SUMMARY OF THE INVENTION

The invention provides a clipped testing device having a conducting member. The clipped testing device is able to scrape the protective film off the electrode by using a scraping structure on a conducting member when the clipped testing device clamps the electrode of a battery. Moreover, the clipped testing device can test the voltage and current characteristics of the battery by using the conducting member directly. Therefore, testing efficiency and accuracy can be improved.

The present invention provides a clipped testing device having a conducting member. The clipped testing device comprises a first clamping member, a second clamping member, a shaft, and a conducting member. The first clamping member has a first pin joint member and a first substrate, the second clamping member has a second pin joint member and a second substrate. The shaft is detachably pivoted to the first pin joint member and the second pin joint member. The conducting member, disposed on the first clamping member and located between the first substrate and the second substrate, has a first bent portion and a second bent portion. The first bent portion bends toward an upper surface of the conducting member. The second bent portion bends toward a lower surface of the conducting member. The second bent portion has first scraping structure, and the first scraping structure protrudes or depresses from the upper surface of the conducting member.

In an embodiment, the lower surface of the conducting member faces toward the first substrate, and the distance between the first bent portion and the first substrate is smaller than the distance between the second bent portion and the first substrate. Moreover, the clipped testing device further comprises a metal plate and a measuring member. The metal plate is disposed on the first clamping member and is located between the first substrate and the conducting member, and the metal plate contacts with the lower surface of the conducting member. The measuring member has a third bent portion and a fourth bent portion, the third bent portion bends toward an upper surface of the measuring member, the fourth bent portion bends toward a lower surface of the measuring member, the fourth bent portion has a second scraping structure, the second scraping structure protrudes or depresses from the upper surface of the measuring member.

The present invention provides another clipped testing device having a conducting member. The clipped testing device comprises a first clamping member, a second clamping member, a shaft, and a conducting member. The first clamping member has a first pin joint member and a first substrate, the second clamping member has a second pin joint member and a second substrate. The shaft is detachably pivoted to the first pin joint member and the second pin joint member. The conducting member, disposed on the first clamping member and located between the first substrate and the second substrate, has a first bent portion and a second bent portion. The first bent portion has a bottom surface, and the second bent portion has a top surface. The bottom surface and the top surface has a predetermined distance therebetween. Wherein the second bent portion has a first scraping structure, and the first scraping structure moves relative to the first substrate when the distance between the bottom surface and the top surface is smaller than the predetermined distance.

The present invention further provides another clipped testing device having a conducting member. The clipped testing device comprises a first clamping member, a second clamping member, a shaft, and a conducting member. The first clamping member has a first pin joint member and a first substrate, the second clamping member has a second pin joint member and a second substrate. The shaft is detachably pivoted to the first pin joint member and the second pin joint member. The conducting member, disposed on first clamping member and located between the first substrate and the second substrate, has an upper surface and a lower surface. The lower surface of the conducting member faces toward the first substrate, and at least part of the conducting member is wavy-shaped and has a first scraping structure on the upper surface.

In summary, the present invention provides a clipped testing device having a conducting member. The conducting member may be a flexible conductive piece that is wavy-shaped and has a scraping structure. When the clipped testing device performs electrical tests to the unit under test (for example, a battery), the scraping structure of the conducting member is capable of clamping the electrode of the battery and scrapes off the protection film from the electrode of battery, thus the conducting member can be utilized to test the characteristics of voltage and current of the battery directly so as to improve the efficiency and accuracy of the testing process.

BRIEF DESCRIPTION OF THE APPENDED DRAWINGS

DETAILED DESCRIPTION OF THE INVENTION

The features, objectives, and functions of the present invention are further disclosed below. However, it is only a few of the possible embodiments of the present invention, and the scope of the present invention is not limited thereto, that is, the equivalent changes and modifications are done in accordance with the claims of the present invention will remain the subject of the present invention. Without departing from the spirit and scope of the invention, it should be considered as further enablement of the invention.

Figure 1:
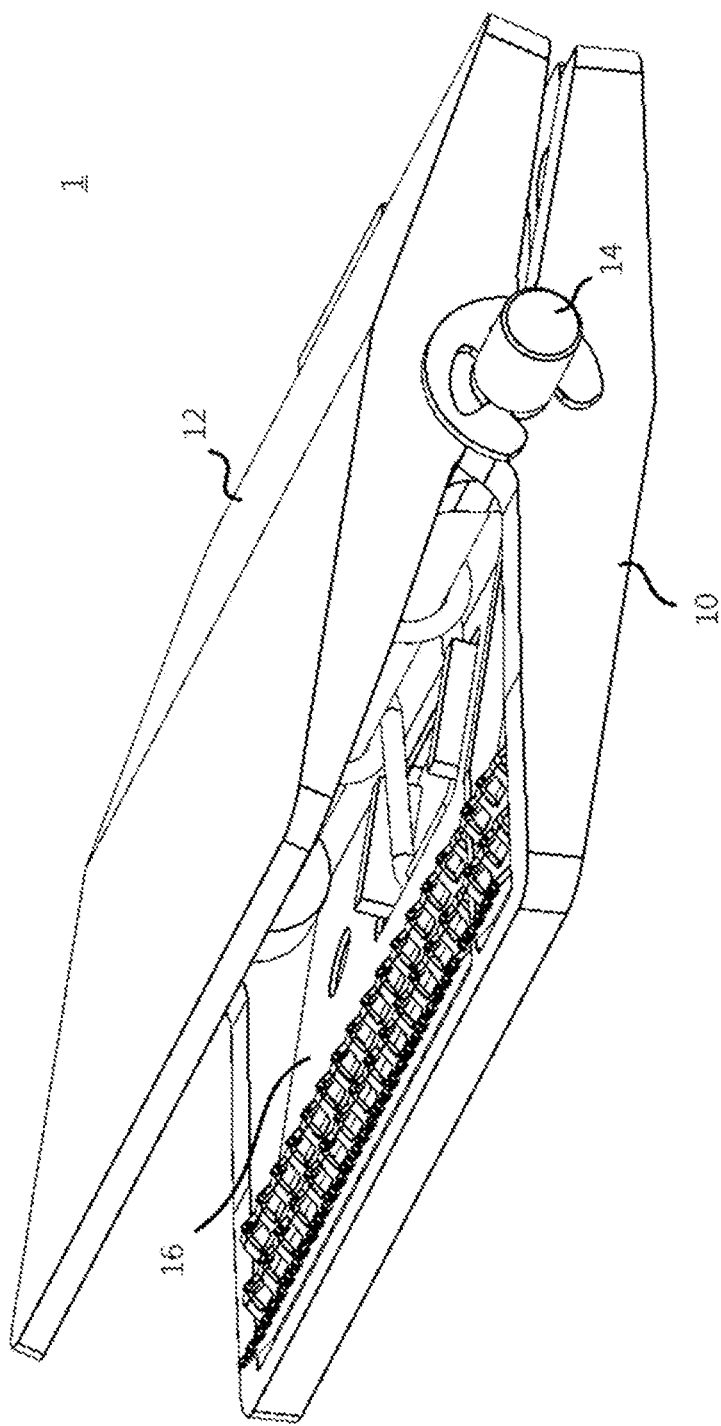
FIG. 1 is a schematic perspective view of a clipped testing device having a conducting member in accordance with an embodiment of the present invention.

Please refer to FIG. 1, FIG. 1 is a schematic perspective view of a clipped testing device having a conducting member in accordance with an embodiment of the present invention. As depicted by FIG. 1, the clipped testing device 1 comprises a first clamping member 10, a second clamping member 12, a shaft 14, and a conducting member 16. The conducting member 16 is located between the first clamping member 10 and the second clamping member 12, and the conducting member 16 is closer to the first clamping member 10 than to the second clamping member 12. The shaft 14 is utilized to pivot the first clamping member 10 and the second clamping member 12 together for allowing the first clamping member 10 and the second clamping member 12 to rotate about the shaft 14. It is apparent to the one having ordinary skill in the art that the first clamping member 10, the second clamping member 12, and shaft 14 can form a clip, allowing the first clamping member 10 and the second clamping member 12 to get close to each other when a force is applied thereto for clamping a unit under test. This embodiment does not limit what kind of unit under test the clipped testing device 1 is utilized to clamp, as long as the unit under test needs to be electrically tested, it is the unit under test that is suitable for being clamped by the clipped testing device 1. For example, the unit under test may optionally be battery, and the clipped testing device 1 is capable of clamping the electrode of the battery for processing electrical tests.

Furthermore, the contour of the unit under test is not limited in the present embodiment. For example, the first clamping member 10 and the second clamping member 12, shown in FIG. 1, are capable of clamping a portion of the unit under test which the portion to be clamped can be piece-shaped, plate-shaped, cylinder-shaped or any other shaped. In one example, when a force is applied respectively to one end of the first clamping member 10 and the corresponding end of the second clamping member 12, the other end of the first clamping member 10 and the corresponding end of the second clamping member 12 can be utilized to clamp the unit under test. The contour of the first clamping member 10 and the second clamping member 12 can be designed to fit the size of the unit under test or to have a thickness that slightly smaller than the unit under test for ensuring the stability when the unit under test is clamped thereby. Of course, the contour of the first clamping member 10 and the second clamping member 12 are not limited in the present embodiment. For example, the first clamping member 10 and the second clamping member 12 as depicted in FIG. 1 can be utilized to clamp the piece-shaped or plate-shaped portion of the unit under test, in another way, the contour of the first clamping member 10 and the second clamping member 12 can be modified to become slightly bent for more suitable for clamping the cylinder-shaped portion of the unit under test. For conciseness, the present embodiment discloses the unit under test can be a battery, and the first clamping member 10 and the second clamping member 12 can clamp the piece-shaped electrode of the battery, however, the present embodiment is not limited thereto.

Figure 2:
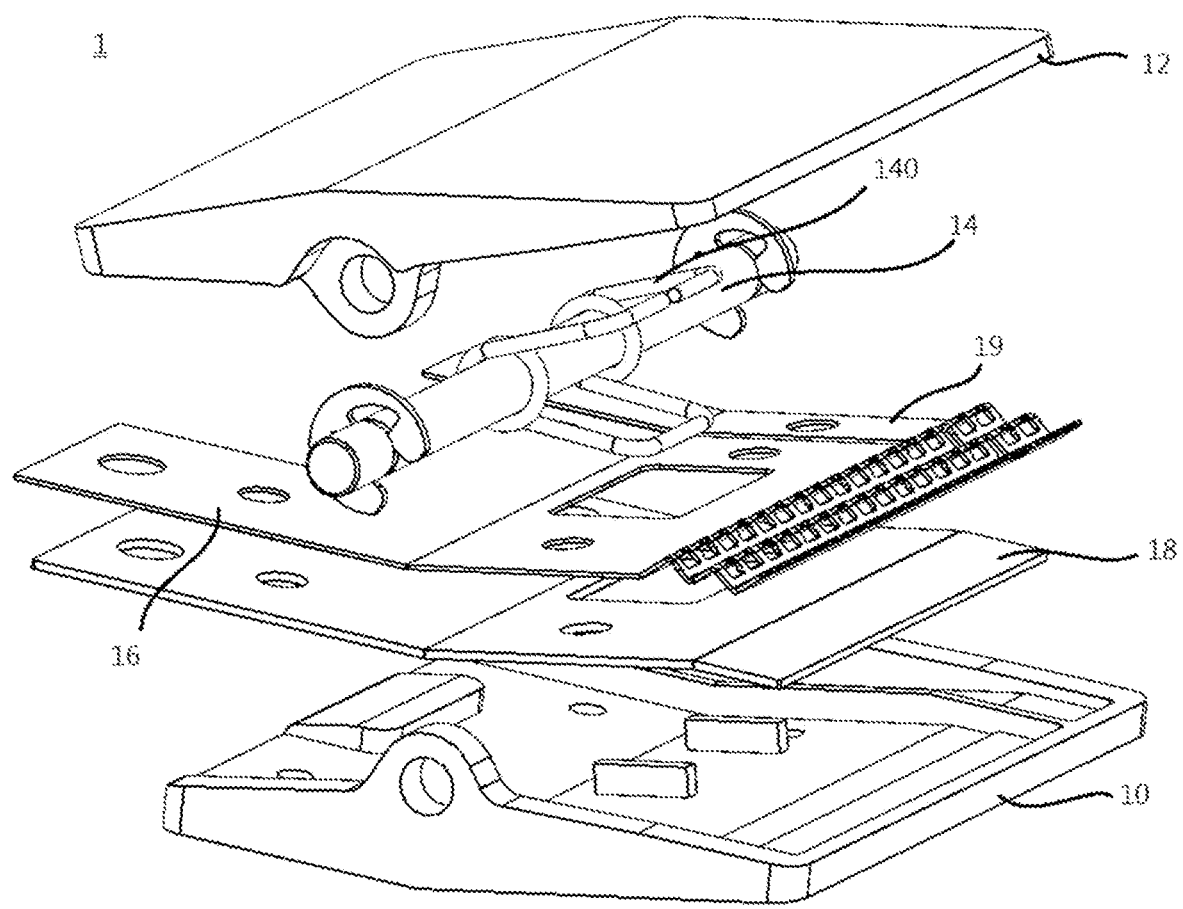
FIG. 2 is an exploded perspective view of a clipped testing device having a conducting member in accordance with an embodiment of the present invention.

FIG. 1 depicts an assembled status of the clipped testing device 1, since some components are not easy to be observed in FIG. 1, so the following clipped testing device 1 can be disassembled for clarity of description. Please also refer to FIG. 1 and FIG. 2, FIG. 2 is an exploded perspective view of a clipped testing device in accordance with an embodiment of the present invention. As depicted in FIG. 2, apart from the first clamping member 10, the second clamping member 12, the shaft 14, and the conducting member 16, the clipped testing device 1 may further comprise a metal plate 18 and a measuring member 19. However, the metal plate 18 and the measuring member 19 are not necessary components and will be described in detail later on. Furthermore, function and description of each of the members will further be explained with perspective figures respectively as following shown.

Figure 3:
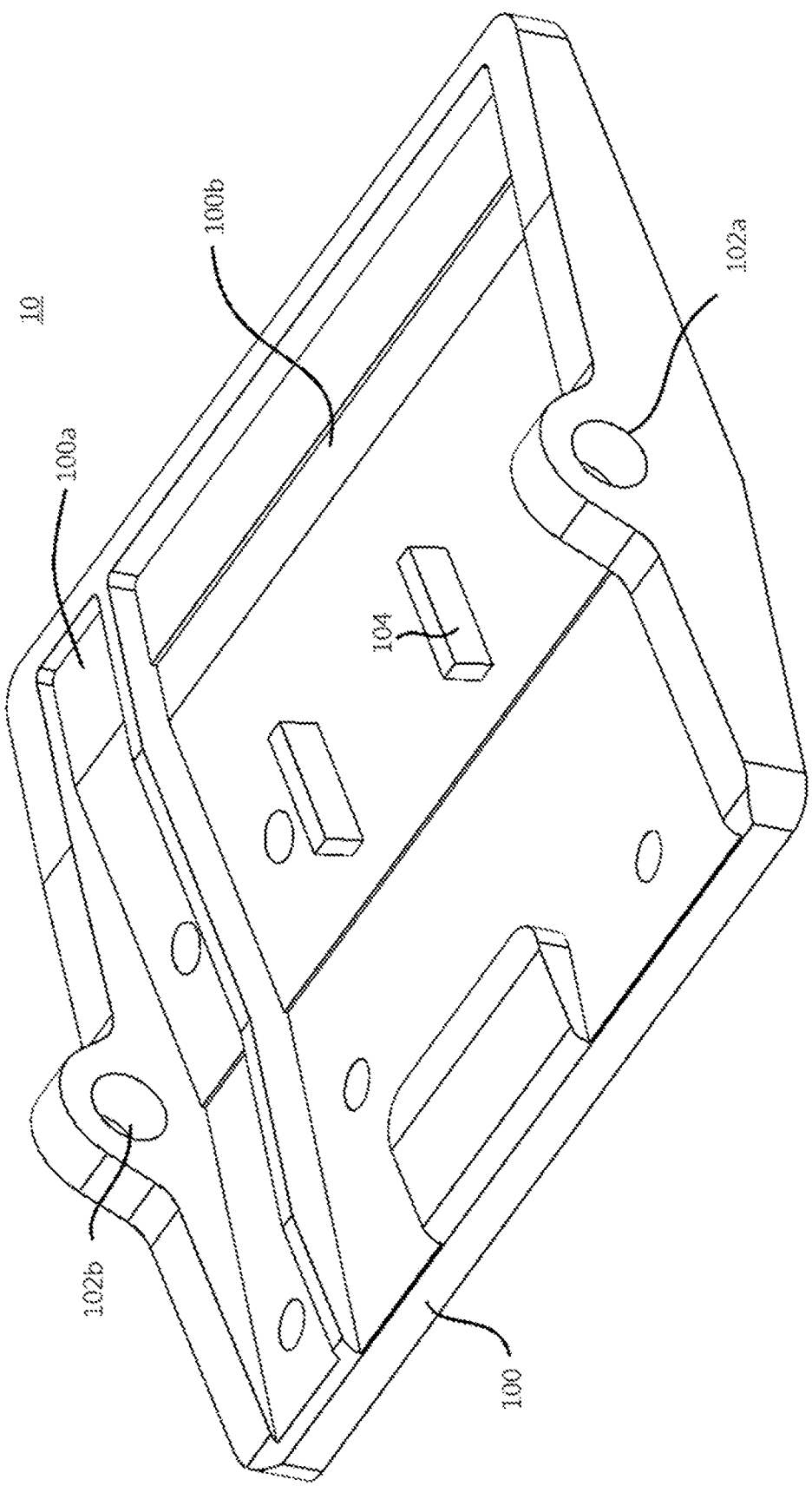
FIG. 3 is a schematic perspective view of a first clamping member in accordance with an embodiment of the present invention.

Please also refer to FIG. 2 and FIG. 3, FIG. 3 is a schematic perspective view of a first clamping member in accordance with an embodiment of the present invention. As depicted in the figures, the first clamping member 10 has a first substrate 100 and first pin joint members 102a and 102b. The contour and the appearance of the first substrate 100 are not limited in the present embodiment, as long as the first substrate 100 is the bottom structure of the first clamping member 10, it is conforming to the scope of the first substrate 100 of the present embodiment. The first pin joint members 102a and 102b connect to first substrate 100. Each of the first pin joint members 102a and 102b may have a through hole respectively, for allowing the shaft 14 to penetrate therethrough and can rotate within a certain range. In practice, although two first pin joint members 102a and 102b are depicted in the figure, as long as there is a pin joint member able to be pivoted to the shaft 14, it is conforming to the scope of the present invention. Therefore, the quantity of the first pin joint member can be one or more, and not limited in the present embodiment. Moreover, although the embodiment discloses a possible way that shaft 14 penetrates the first pin joint members 102a and 102b, the one having ordinary skill in the art can also replace the means of articulation between the first clamping member 10 and the shaft 14 and not limited by the present embodiment.

In one example, the first substrate 100 has a first fixing member 104 thereon. The first fixing member 104 can be utilized to position an elastic member 140 on the shaft 14, and allow the elastic member 140 to be stuck in the center portion of the first substrate 100. Because the first fixing member 104 can prevent the elastic member 140 from sliding relatively to the shaft 14 or the first substrate 100, the clamping force for holding the unit under test or the restoring force for releasing the unit under test can be maintained. In practice, the elastic member 140 may optionally be a spiral spring or a leaf spring, for tightening the first clamping member 10 and the second clamping member 12 or for keeping the clamping member away from each other. The form of elastic member 140 is not limited by the present embodiment. Moreover, the first fixing member 104 can protrude from the first substrate 100, and penetrate the conducting member 16 when the clipped testing device 1 is well assembled so as to assist the positioning of the conducting member 16 and prevent the conducting member 16 from departing from its predetermined position.

Moreover, the first substrate 100 can be divided into two regions 100a and 100b for accommodating the measuring member 19 and the conducting member 16. Since the measuring member 19 and the conducting member 16 have different electrical measuring purposes, the regions 100a and 100b on the first substrate 100 need to make the measuring member 19 and the conducting member 16 isolated from each other. In practice, the regions 100a and 100b on the first substrate 100 can be two recesses, the recess shape of the region 100a corresponds to the shape of the measuring member 19, the recess shape of the region 100b corresponds to the shape of the conducting member 16. Therefore, the measuring member 19 and the conducting member 16 can fit in the regions 100a and 100b, respectively, that the movement of the measuring member 19 and the conducting member 16 can be reduced. Moreover, the measuring member 19 and the conducting member 16 can also be, but not limited to, fixed directly or stuck into the regions 100a and 100b, respectively.

Figure 4:
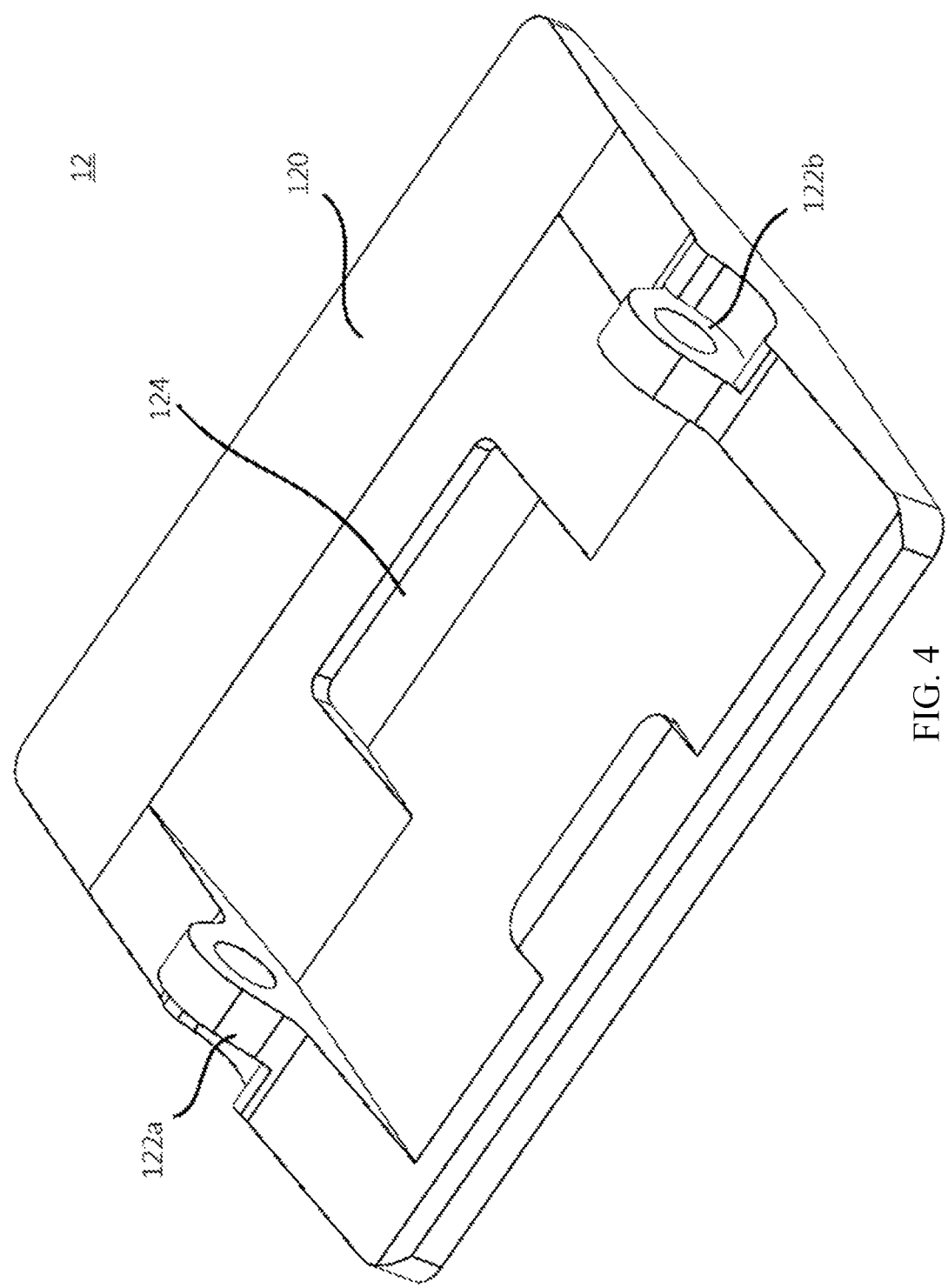
FIG. 4 is a schematic perspective view of a second clamping member in accordance with an embodiment of the present invention.

Please also refer to FIG. 2 and FIG. 4, FIG. 4 is a schematic perspective view of a second clamping member in accordance with an embodiment of the present invention. As depicted in the figures, the second clamping member 12 has a second substrate 120 and second pin joint members 122a and 122b. Likewise, the contour or appearance of the second substrate 120 are not limited as previously described, as long as the second substrate 120 is the bottom structure of the second clamping member 12, it is conforming to the scope of the second substrate 120 of the present embodiment. The second pin joint members 122a and 122b connect to second substrate 120. Each of the second pin joint members 122a and 122b may have a through hole respectively. In practice, the shaft 14 can penetrate the first pin joint members 102a and 102b and the second pin joint members 122a and 122b at the same time. Therefore, the first clamping member 10 and the second clamping member 12 are pivoted together via the shaft 14, and the first clamping member 10 and the second clamping member 12 are capable of pivoting on the shaft 14.

In one example, the second substrate 120 has a second fixing member 124 for positioning the elastic member 140 of the shaft 14, and allow the elastic member 140 to be stuck in the center portion of the second substrate 120. Because the second fixing member 124 can prevent the elastic member 140 from sliding relatively to the shaft 14 or the second substrate 120, the clamping force for holding the unit under test or the restoring force for releasing the unit under test can be maintained. Although the present embodiment discloses each of the first substrate 100 and the second substrate 120 has its own fixing member, however, the fixing members are not necessary. It is possible that only one of the first substrate 100 and the second substrate 120 has a fixing member. Moreover, in the present embodiment, the conducting member 16 is assembled to the first clamping member 10. In practice, the conducting member 16 can also be assembled to the second clamping member 12, or the first clamping member 10 and the second clamping member 12 can be assembled to its own conducting member, respectively.

To be noted, although the present embodiment discloses that the first pin joint members 102a and 102b are located at the center portion of the first substrate 100, which means the first pin joint members 102a and 102b are approximately located at two lateral sides of the center portion of the first clamping member 10. And, the second pin joint members 122a and 122b are located at the center portion of the second substrate 120, which means the second pin joint members 122a and 122b are approximately located at two lateral sides of the center portion of the second clamping member 12. The present embodiment is not limited thereto. In one example, the first pin joint members 102a and 102b and the second pin joint members 122a and 122b can be disposed on the corresponding/adjacent end of the first substrate 100 and the second substrate 120, respectively. The one having ordinary skill in the art should understand that the locations of the first pin joint members 102a and 102b and the locations of the second pin joint members 122a and 122b are related to how the first clamping member 10 and the second clamping member 12 be driven. For example, if the first clamping member 10 and the second clamping member 12 are compressed or pushed from one end of the first substrate 100 and the second substrate 120, allowing another end of the first substrate 100 and the second substrate 120 to open or close, thus the first pin joint members 102a and 102b and the second pin joint members 122a and 122b can be located at the center portion of the first substrate 100 and the second substrate 120 as described in the present embodiment.

Besides, since the clipped testing device 1 is utilized to process electrical tests to the unit under test, therefore the first clamping member 10 and the second clamping member 12 can be formed of insulating material, such as plastic, so that the first clamping member 10 and the second clamping member 12 can cause less interference to the test result. The first substrate 100 and the first pin joint members 102a and 102b of the first clamping member 10 may be integrally formed, meanwhile the second substrate 120 and the second pin joint members 122a and 122b of the second clamping member 12 can also be integrally formed.

Figure 5:
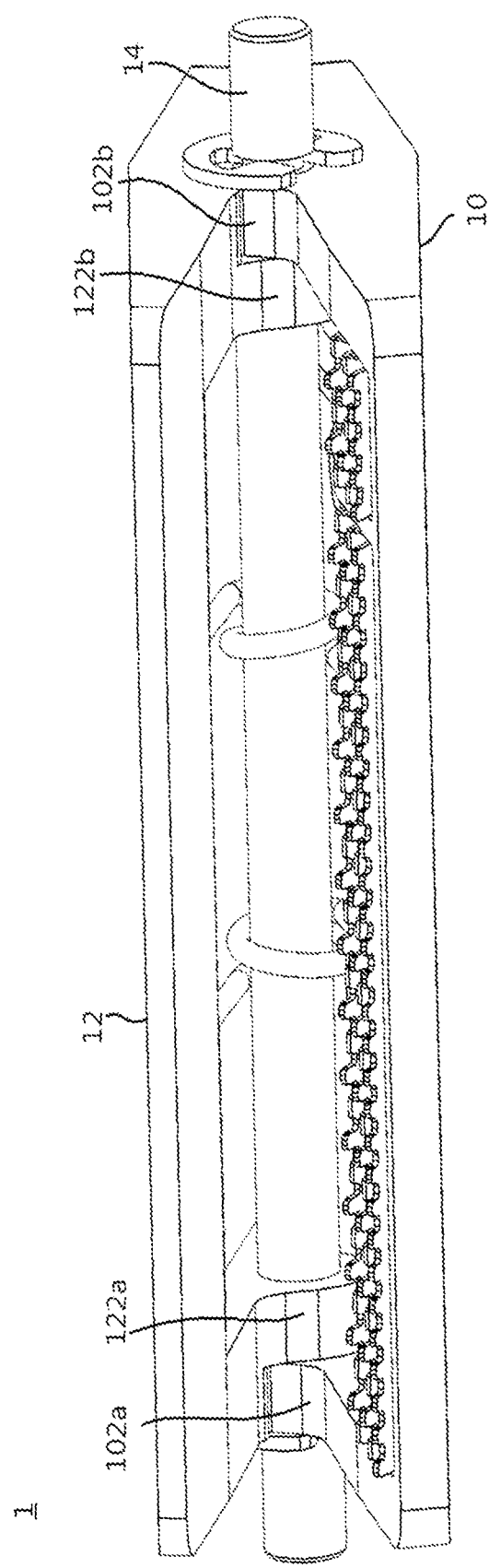
FIG. 5 is another schematic perspective view of a clipped testing device having a conducting member in accordance with an embodiment of the present invention.

In order to describe how the first clamping member 10 and the second clamping member 12 be pivoted together via the shaft 14, please refer to FIG. 2 and FIG. 5, FIG. 5 is another schematic perspective view of a clipped testing device having a conducting member in accordance with an embodiment of the present invention. As depicted in the figures, the distance between two first pin joint members 102a and 102b of the first clamping member 10, as shown in the present embodiment, is slightly larger than the distance between two second pin joint members 122a and 122b of the second clamping member 12. Thus, the two first pin joint members 102a and 102b of the first clamping member 10 can be located at the outside of the lateral side of the two second pin joint members 122a and 122b of the second clamping member 12. The shaft 14 has a long shaped pole which penetrates through the through holes of the first pin joint members 102a and 102b and the second pin joint members 122a and 122b. The shaft 14 can further have a clip to be fixed to the outside of the first pin joint members 102a and 102b so that the first clamping member 10 and the second clamping member 12 can be pivoted together via the shaft 14.

Figure 6:
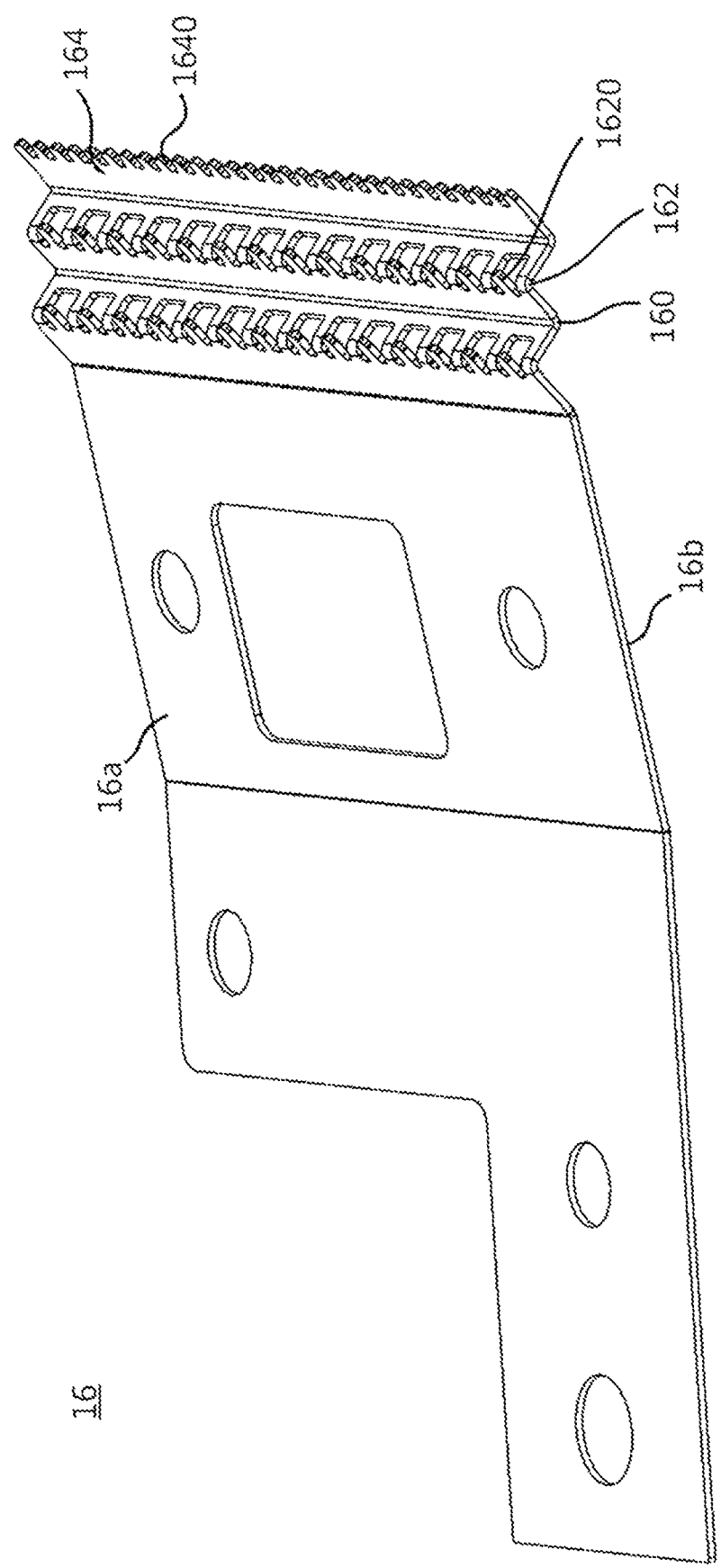
FIG. 6 is a schematic perspective view of a conducting member in accordance with an embodiment of the present invention

Please also refer to FIG. 2 and FIG. 6, FIG. 6 is a schematic perspective view of a conducting member in accordance with an embodiment of the present invention. As depicted in the figures, the conducting member 16 has a first bent portion 160 and a second bent portion 162, the first bent portion 160 bends toward the upper surface 16a of the conducting member 16, and the second bent portion 162 bends toward the lower surface 16b of the conducting member 16. In detail, the conducting member 16 is disposed on the first substrate 100. The lower surface 16b of the conducting member 16 of the present embodiment is not limited to contact with the first substrate 100 directly, as long as the lower surface 16b of the conducting member 16 faces toward the first substrate 100, it is conforming to the scope of the present invention. Besides, part of the conducting member 16 is wavy-shaped. The first bent portion 160 is referred to the portion of the conducting member 16 that is wavy-shaped and bends toward the upper surface 16a of the conducting member 16, the second bent portion 162 is referred to the portion of the conducting member 16 that is wavy-shaped and bends toward the lower surface 16b of the conducting member 16. I t is depicted that, the first bent portion 160 is lower than the second bent portion 162 so that the distance between the first bent portion 160 and the first substrate 100 is smaller than the distance between the second bent portion 162 and the first substrate 100.

The quantity of the first bent portion 160 and the quantity of the second bent portion 162 are not limited in the present embodiment. For those skilled in the art can understand that more times the conducting member 16 is bent, more the first bent portion 160 and the second bent portion 162 can be applied. As long as the conducting member 16 has at least one first bent portion 160 and at least one second bent portion 162, it is conforming to the scope of the conducting member 16 of the present embodiment. Moreover, the present embodiment discloses that the first bent portion 160 and the second bent portion 162 are parallel to each other, and two of the first bent portion 160 can be, but not limited to, adjacent to one second bent portion 162. In one embodiment, the first bent portion 160 and the second bent portion 162 may optionally be W shaped or V shaped, that the first bent portion 160 and the second bent portion 162 are arranged alternately and not necessarily be parallel to each other.

Figure 7:
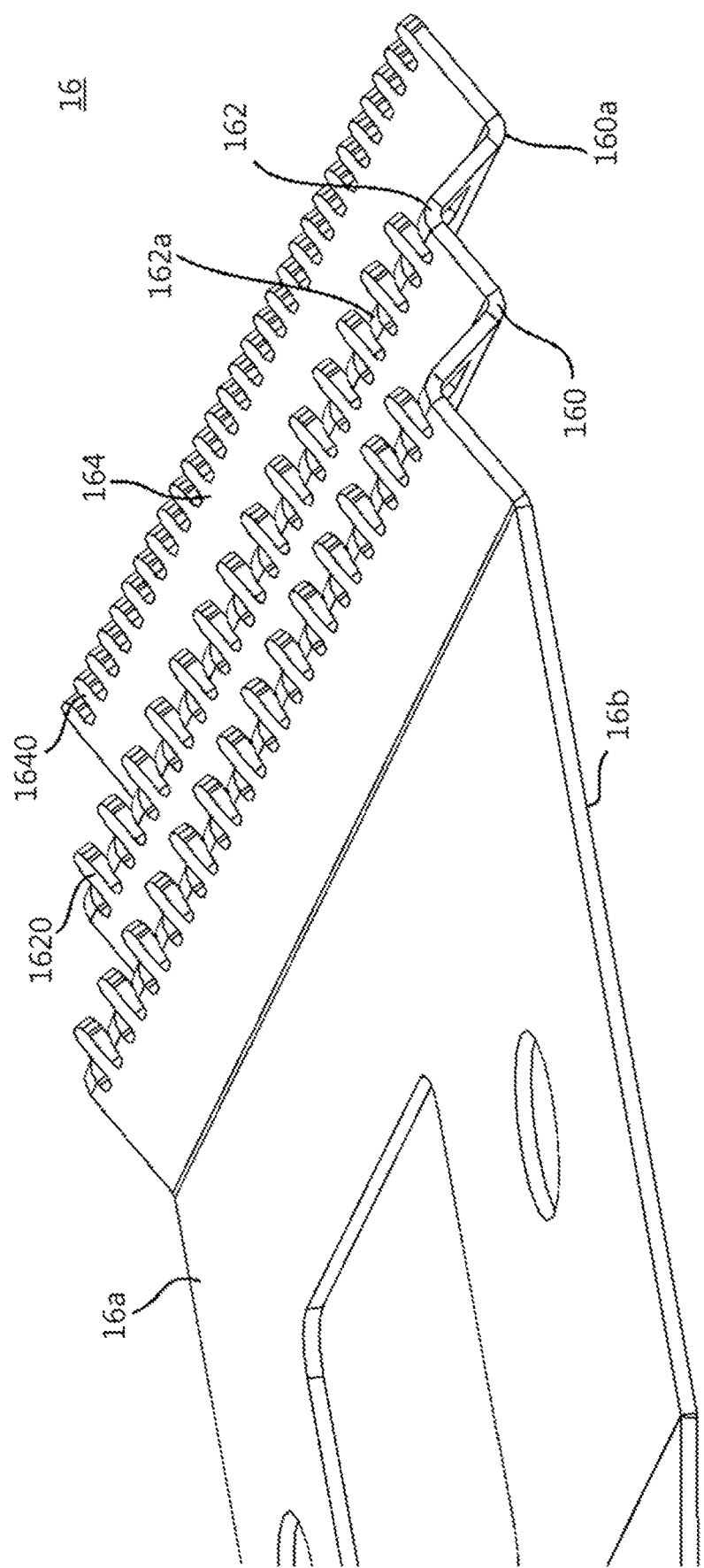
FIG. 7 is a partial schematic view of a conducting member in accordance with an embodiment of the present invention.

For describing the design of the conducting member 16 in detail, especially the first scraping structure 1620 of the second bent portion 162, please also refer to FIG. 6 and FIG. 7, FIG. 7 is a partial schematic view of a conducting member in accordance with an embodiment of the present invention. As depicted in the figures, the second bent portion 162 has the first scraping structure 1620, and the first scraping structure 1620 is located at the side of the upper surface 16a of the conducting member 16. In practice, since the lower surface 16b of the conducting member 16 bends toward the first substrate 100, and the lower surface 16b is not utilized to contact with the unit under test. Therefore, the first scraping structure 1620 has to be disposed on the upper surface 16a side of the conducting member 16. And, the first scraping structure 1620 can contact with the unit under test when the first clamping member 10 and the second clamping member 12 is clamping the unit under test.

In practice, one of the functions of the conducting member 16 is to provide voltage and current to the unit under test, and therefore the conducting member 16 may optionally be metal or any other electronically conductive material. In other words, the material of the conducting member 16 is flexible, especially the conducting member 16 has a first bent portion 160 and a second bent portion 162. When external forces are applied between the bottom surface 160a of the first bent portion 160 (or the lower surface 16b of the conducting member 16) and the top surface 162a of the second bent portion 162 (or upper surface 16a of the conducting member 16), the distance between the bottom surface 160a and the top surface 162a will be slightly shorten. In contrast, the conducting member 16 can be extended toward a terminal portion 164 located at an end thereof, that the total length of the conducting member 16 in view of the first substrate 100 can be slightly increased.

For example, if the unit under test is a battery, then the first clamping member 10 and the second clamping member 12 is able to hold the electrode of the battery by clamping thereto so as to perform an electrical test. However, before the battery leaves the factory, in order to prevent the oxidation or damage to the battery, a protection film formed of insulating material is usually be stacked onto the surface of the electrode. Therefore, one of another function of the conducting member 16 is that the conducting member is capable of scraping the protection film off the electrode without peeling the protection film off beforehand. The present embodiment depicts a first scraping structure 1620 that protrudes from the upper surface 16a of the conducting member 16, and the first scraping structure 1620 bends toward the terminal portion 164 for scraping the protection film off the electrode.

As described, when the first clamping member 10 and the second clamping member 12 clamping the electrode of the battery, the top surface 162a of the second bent portion 162 of the conducting member 16 (especially the first scraping structure 1620) push against the electrode of the battery. Then the bottom surface 160a is supported by the first substrate 100, and the conducting member 16 can take external force between the bottom surface 160a and the top surface 162a, so that the conducting member 16 can be slightly deformed due to the flexibility provided by the material and the wavy-shaped contour thereof. In other words, the distance between the bottom surface 160a and the top surface 162a will be shortened and the total length of the conducting member 16 can be slightly increased relative to the first substrate 100. As a result, the first scraping structure 1620 can push against the electrode of the battery and have certain displacement, so as to scrape the protection film off the electrode by friction among the first scraping structure 1620 and electrode.

The arrangement, shapes, and dimensions of the first scraping structure 1620 are not limited by the present embodiment. For example, the first scraping structure 1620 may optionally be arranged in form of a matrix or predetermined figure. Viewing from the upper surface 16a of the conducting member 16, the first scraping structure 1620 may optionally be triangular shaped, trapezoidal shaped, rectangular shaped or in other formed, as long as capable of scraping the protection film off the electrode, it is conforming to the scope of the present first scraping structure 1620 of present embodiment. Moreover, in one example, the protection film on the electrode can also be scraped off when only part of the first scraping structure 1620 inclines and bends toward terminal portion 164, and another part of the first scraping structure 1620 inclines and bends toward other direction. In summary, the direction that the first scraping structure 1620 bends toward is not limited, even if the first scraping structure 1620 is not inclines and thrust into the protection film directly, the conducting member 16 still can contact with the electrode of battery and process the electrical test. Moreover, the terminal portion 164 formed at the cutting edge of the conducting member 16 can also have the third scraping structure 1640 formed thereon. The arrangement, shapes, and dimensions of the third scraping structure 1640 can either be the same with or be different from the first scraping structure 1620 and also not limited by the present embodiment.

Figure 8:
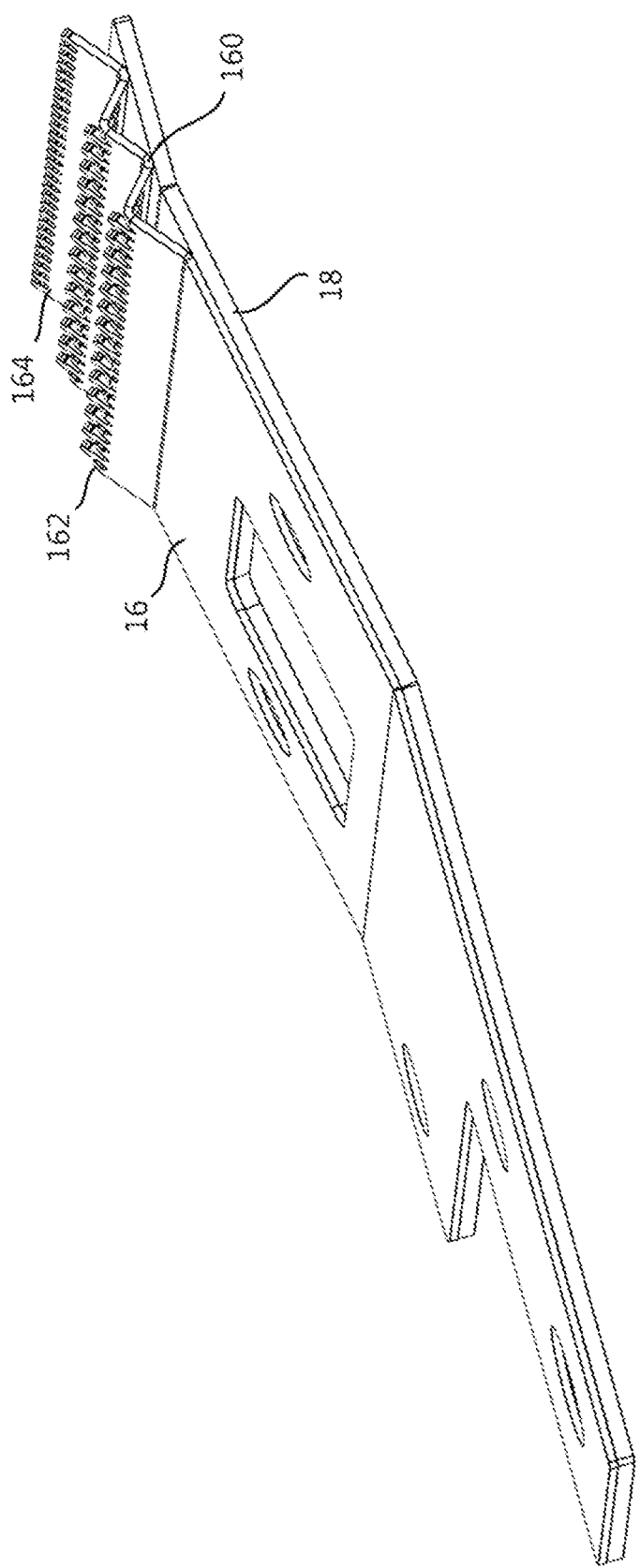
FIG. 8 is a schematic perspective view of a conducting member and metal plate in accordance with an embodiment of the present invention.

Although the thickness of the conducting member 16 in the present embodiment is not limited, since the conducting member 16 may provide voltage and current to unit under test, the resistant may be increased if the thickness of the conducting member 16 is not enough. In response to the said situation, the metal plate 18 can be disposed between the conducting member 16 and first substrate 100. Please also refer to FIG. 2 and FIG. 8, FIG. 8 is a schematic perspective view of a conducting member and metal plate in accordance with an embodiment of the present invention. As depicted in the figures, the conducting member 16 is tightly bonded to the metal plate 18. In the electrical test, apart from utilizing only the conducting member 16 to transmit current, the metal plate 18 can provide another current path for the said electrical test. As described previously, the metal plate 18 is not essential, if large current is not required in the electrical test, or the conducting member 16 has enough thickness, then the conducting member 16 can be fixed directly onto the first substrate 100. In contrast, if large current is required in the electrical test, or the conducting member 16 is too thin, then the conducting member 16 is suggested to be fixed to the first substrate 100 with the metal plate 18. However, in the present embodiment, no matter which situation it is, the conducting member 16 should always be disposed on the first clamping member 10 and located between the first substrate 100 and the second substrate 120.

Figure 9:
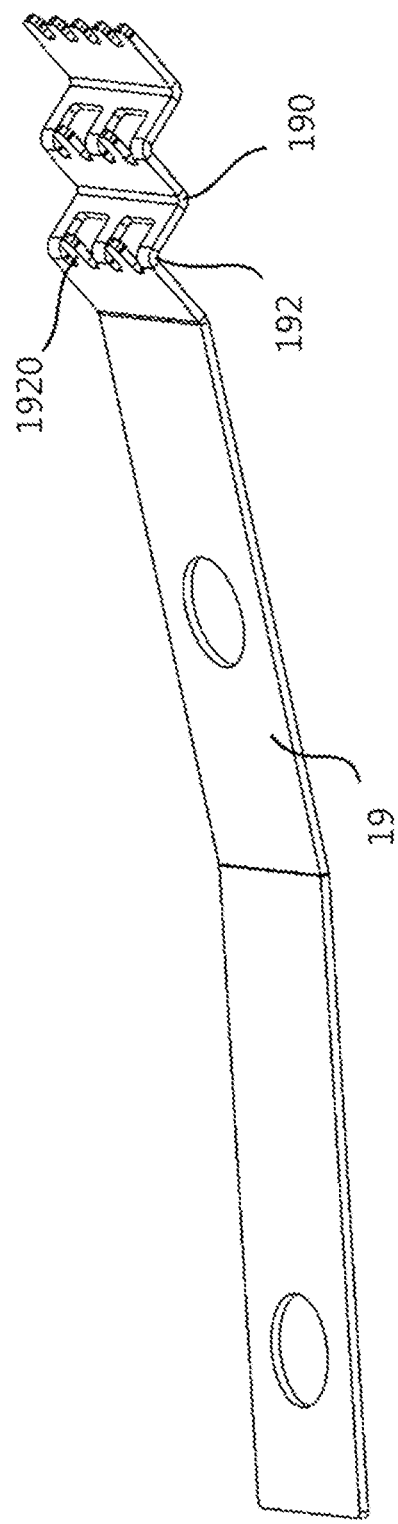
FIG. 9 is a schematic perspective view of a measuring member in accordance with an embodiment of the present invention.

The present embodiment does not limit the contour or the dimension of the metal plate 18, as long as the metal plate 18 is disposed between the conducting member 16 and the first substrate 100, and is capable of providing a current path from external testing device to the electrode of the battery, it is conforming to the scope of the metal plate 18 of the present embodiment. Moreover, the clipped testing device 1 can further have a measuring member 19, please also refer to FIG. 2 and FIG. 9, FIG. 9 is a schematic perspective view of a measuring member in accordance with an embodiment of the present invention. As depicted in the figures, the contour of the measuring member 19 can be similar to the conducting member 16, and also is located between the first substrate 100 and the second substrate 120. The dimension of the measuring member 19 can be slightly smaller than the conducting member 16. As disclosed in the present embodiment, the measuring member 19 is assembled with the first clamping member 10. However, the measuring member 19 can alternatively be assembled with the second clamping member 12, the first clamping member 10 and the second clamping member 12 can also have its own measuring member assembled thereto respectively.

Moreover, measuring member 19 may have a third bent portion 190 and a fourth bent portion 192. The third bent portion 190 can also bend toward the upper surface of the measuring member 19, the fourth bent portion 192 can also bend toward the lower surface of the measuring member 19. The fourth bent portion 192 can also have a second scraping structure 1920, the second scraping structure 1920 can protrude or depress from the upper surface of the measuring member 19. The structural of measuring member 19 can be similar to the structure of the conducting member 16, and details thereof can refer to the previous description and will be omitted herein for concision.

The conducting member 16 comprises a function of providing large current to the battery. To maintain power transmission efficiency, the conducting member 16 can be stacked onto the metal plate 18. And the function of measuring member 19 is to sense the voltage of the battery, so that the battery can be prevent from being overcharged or having abnormal voltage caused by other reasons. Because the measuring member 19 does not need to transmit large current and therefore does not need to be stacked onto the metal plate 18, and the dimension of the measuring member 19 can be slightly smaller than the conducting member 16. In another embodiment, the measuring member 19 can also be stacked onto the metal plate 18. For ensuring the accuracy of measuring voltage by measuring member 19, the measuring member 19 is not electrically connected to the conducting member 16, or say, the measuring member 19 and the conducting member 16 can use its own metal plate respectively. To be noted, the measuring member 19 can be referred to a portion of the conducting member 16 when the measuring member 19 and the conducting member 16 share the same metal plate 18. Although the measuring member 19 and the conducting member 16 can still be operable for its own function respectively, but the measuring member 19 is more likely to be disrupted by the conducting member 16 when the conducting member 16 provides voltage or current, and it might be difficult to measure the voltage of the battery real time.

Figure 10:
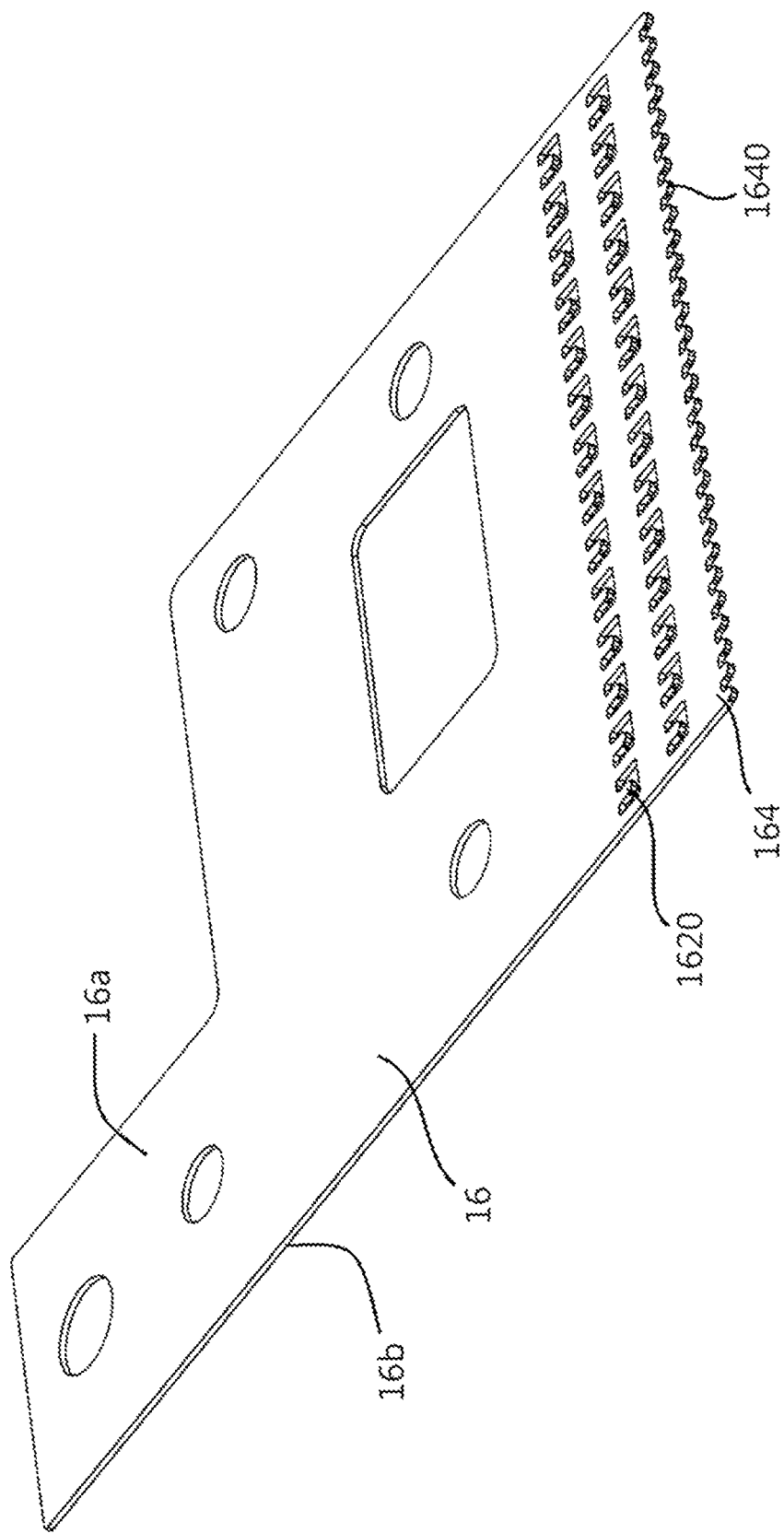
FIG. 10 is a schematic perspective view of a conducting member before being bent in accordance with an embodiment of the present invention

About the manufacturing process of the measuring member 19 and the conducting member 16, the wavy-shaped first bent portion 160 and the second bent portion 162 can be integrally formed by a stamping process. Using the conducting member 16 as an example, please refer to FIG. 10, FIG. 10 is a schematic perspective view of a conducting member before being bent in accordance with an embodiment of the present invention. As depicted in FIG. 10, the conducting member 16 may optionally be one flat plate-shaped material before bending, and the scraping structure 1620 can be formed by a stamping process, and the wavy-shaped first bent portion 160 and the second bent portion 162 is also formed by using the same stamping process. In practice, the first scraping structure 1620 can be formed along with the wavy-shaped first bent portion 160 and the second bent portion 162 in one single stamping step, and the order of forming the first scraping structures 1620 are not limited thereto. Moreover, as known by the one having ordinary skill in the art, in order to form the first scraping structure 1620 and the wavy-shaped first bent portion 160 and the second bent portion 162, the stamping process might be the most convenient way. However, the present embodiment does not exclude other possible manufacturing means, for example, laser cutting the first scraping structure 1620, and bending the first bent portion 160 and the second bent portion 162 to wavy-shaped by any known metal deforming technique are also possible means.

Figure 11:
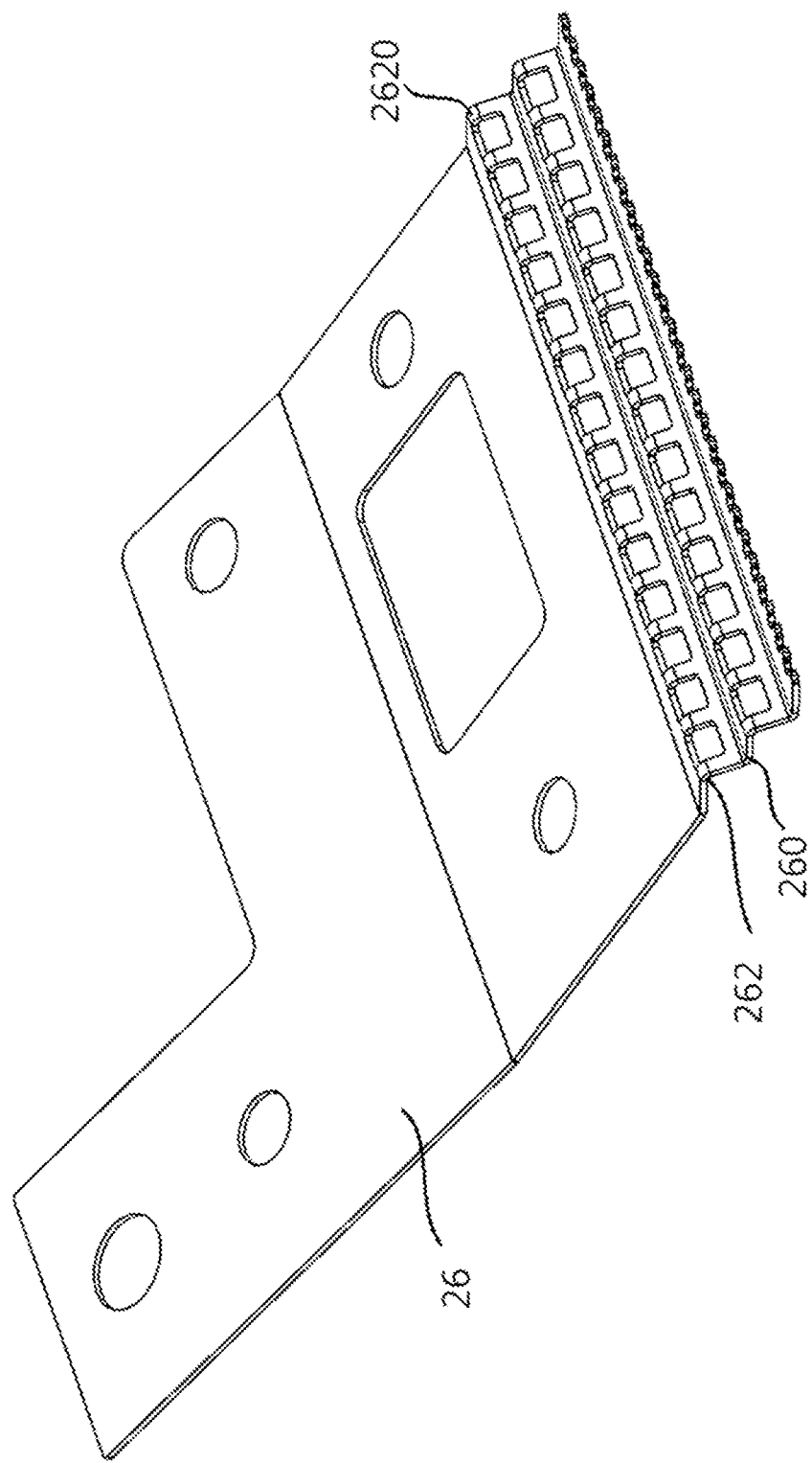
FIG. 11 is a schematic perspective view of a conducting member in accordance with another embodiment of the present invention

At last, the first scraping structure 1620 described in the present embodiment is not limited to protrude from the upper surface 16a of the conducting member 16. Please refer to FIG. 11, FIG. 11 is a schematic perspective view of a conducting member in accordance with another embodiment of the present invention. As depicted in FIG. 11, another design of conducting member 26 can also have a first bent portion 260 and the second bent portion 262 arranged in wavy-shape, and the first scraping structure 2620 can also depress from the upper surface of the conducting member 26. Therefore, the top surface of the second bent portion 262 can be partially depressed, so as to form a rough or unsmooth surface which can also be utilized to scrape the protection film off the electrode. Besides, the top surface of the second bent portion 262 can be relatively rough and can be configured to push against the electrode when the clipped testing device 1 clamps the electrode. The protective film can be removed when the conducting member 26 is extended since the electrode is scrubed by the second bent portion 262.

In summary, the clipped testing device provided by the present invention has a wavy-shaped conducting member. When the unit under test is clamped, the conducting member not only contacts the unit under test but can also be slightly deformed, thereby utilizing the scraping structure of the conducting member to scrape the protective film layer off from the battery electrode, thereby the additional step of removing the protective film on the electrode can be omitted, and the voltage and current characteristics of the battery can be measured directly, improving the overall efficiency and accuracy of the battery electrical test.

What is claimed is:

1. A clipped testing device, comprising:
a first clamping member, having a first substrate and a first pin joint member;
a second clamping member, having a second substrate and a second pin joint member;
a shaft, detachably pivoted to the first pin joint member and the second pin joint member;
a conducting member, being flexible and disposed on the first clamping member and located between the first substrate and the second substrate, the conducting member having a first bent portion and a second bent portion, the first bent portion bending toward an upper surface of the conducting member, the second bent portion bending toward a lower surface of the conducting member, the second bent portion having a first scraping structure, the first scraping structure protruding or depressing from the upper surface of the conducting member; and
a metal plate, disposed on the first clamping member, located between the first substrate and the conducting member, and contacting with the lower surface of the conducting member,
wherein the lower surface of the conducting member faces toward the first substrate, and distance between the first bent portion and the first substrate is smaller than distance between the second bent portion and the first substrate.

2. The clipped testing device according to claim 1, further comprises a measuring member, located between the first substrate and the second substrate, the measuring member has a third bent portion and a fourth bent portion, the third bent portion bends toward an upper surface of the measuring member, the fourth bent portion bends toward a lower surface of the measuring member, the fourth bent portion has a second scraping structure, the second scraping structure protrudes or depresses from the upper surface of the measuring member.

3. The clipped testing device according to claim 2, wherein the conducting member is not electrically connected to the measuring member and the upper surface of the conducting member is substantially coplanar to the upper surface of the measuring member.

4. The clipped testing device according to claim 1, wherein the conducting member is formed of metal, and the first bent portion and the second bent portion are integrally formed.

5. The clipped testing device according to claim 1, wherein a terminal portion of the conducting member is adjacent to the first bent portion, the terminal portion has a third scraping structure.

6. A clipped testing device, comprising:
a first clamping member, having a first substrate and a first pin joint member;
a second clamping member, having a second substrate and a second pin joint member;
a shaft, detachably pivoted to the first pin joint member and the second pin joint member; and
a conducting member, disposed on the first clamping member and located between the first substrate and the second substrate, the conducting member having a first bent portion and a second bent portion, the first bent portion having a bottom surface, the second bent portion having a top surface, the bottom surface and the top surface having a predetermined distance therebetween;
wherein the second bent portion has a first scraping structure,
wherein when the distance between the bottom surface and the top surface is smaller than the predetermined distance, the first scraping structure moves closer to the first substrate.

7. The clipped testing device according to claim 6, wherein the bottom surface of the first bent portion faces toward the first substrate, the top surface of the second bent portion faces toward the second substrate, and the distance between the first bent portion and the first substrate is smaller than the distance between the second bent portion and the first substrate.

8. The clipped testing device according to claim 7, further comprises a metal plate, disposed on the first clamping member and located between the first substrate and the conducting member, the metal plate contacts with the conducting member.

9. The clipped testing device according to claim 8, further comprises a measuring member, located between the first substrate and the second substrate, the measuring member has a third bent portion and a fourth bent portion, the third bent portion bends toward an upper surface of the measuring member, the fourth bent portion bends toward a lower surface of the measuring member, the fourth bent portion has a second scraping structure, the second scraping structure protrudes or depresses from the upper surface of the measuring member.

10. The clipped testing device according to claim 9, wherein the conducting member is not electrically connected to the measuring member.

11. The clipped testing device according to claim 6, wherein the conducting member is formed of metal, and the first bent portion and the second bent portion are integrally formed.

12. The clipped testing device according to claim 6, wherein a terminal portion of the conducting member is adjacent to the first bent portion, the terminal portion has a third scraping structure.

13. A clipped testing device, comprising:
- a first clamping member, having a first substrate and a first pin joint member;
- a second clamping member, having a second substrate and a second pin joint member;
- a shaft, detachably pivoted to the first pin joint member and the second pin joint member;
- a conducting member, disposed on the first clamping member and located between the first substrate and the second substrate, the conducting member having an upper surface and a lower surface, the lower surface of the conducting member facing toward the first substrate, at least portion of the conducting member being wavy-shaped and having a first scraping structure on the upper surface; and
- a measuring member, disposed between the first substrate and the second substrate, at least portion of the measuring member is wavy-shaped and has a second scraping structure thereon.

14. The clipped testing device according to claim 13, further comprises a metal plate, disposed on the first clamping member and located between the first substrate and the conducting member, the metal plate contacting with the conducting member.

15. The clipped testing device according to claim 13, wherein the wavy-shaped conducting member has a predetermined length and a predetermined thickness, when the thickness of the wavy-shaped conducting member is smaller than the predetermined thickness, the length of the wavy-shaped conducting member is longer than the predetermined length and the first scraping structure moves closer to the first substrate.

* * * * *